United States Patent
Sato et al.

(10) Patent No.: US 10,090,806 B2
(45) Date of Patent: Oct. 2, 2018

(54) POWER AMPLIFIER CIRCUIT

(71) Applicant: Murata Manufacturing Co., Ltd., Kyoto (JP)

(72) Inventors: Tsuyoshi Sato, Kyoto (JP); Hidetoshi Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/674,696

(22) Filed: Aug. 11, 2017

(65) Prior Publication Data
US 2018/0062578 A1    Mar. 1, 2018

(30) Foreign Application Priority Data
Aug. 31, 2016   (JP) ................. 2016-169265

(51) Int. Cl.
| | | |
|---|---|---|
| *H03K 5/22* | (2006.01) | |
| *H03F 1/02* | (2006.01) | |
| *H03F 3/19* | (2006.01) | |
| *H03F 3/24* | (2006.01) | |
| *H04B 1/04* | (2006.01) | |
| *H04B 1/16* | (2006.01) | |

(52) U.S. Cl.
CPC ............. *H03F 1/02* (2013.01); *H03F 3/19* (2013.01); *H03F 3/245* (2013.01); *H04B 1/04* (2013.01); *H04B 1/16* (2013.01); *H03F 2200/165* (2013.01); *H04B 2001/0408* (2013.01)

(58) Field of Classification Search
CPC ........... H03K 5/24; H03F 1/301; H03F 1/086; H03F 1/0244; H03F 1/0211; H03F 1/302; H03F 1/32; H03F 3/19; H03F 3/505; H03F 3/45475; H03F 3/1935; H03F 3/193; H03F 3/211; H03F 3/602; H03F 3/302; H03G 1/0088

See application file for complete search history.

(56) References Cited

U.S. PATENT DOCUMENTS

| | | | | |
|---|---|---|---|---|
| 2004/0164803 | A1* | 8/2004 | Canyon | H03F 1/0211 |
| | | | | 330/285 |
| 2008/0242246 | A1 | 10/2008 | Minnis | |
| 2012/0146731 | A1* | 6/2012 | Khesbak | H03F 1/0222 |
| | | | | 330/295 |
| 2014/0022021 | A1* | 1/2014 | Kusachi | H03F 1/0272 |
| | | | | 330/296 |

FOREIGN PATENT DOCUMENTS

| | | |
|---|---|---|
| JP | 2009-503983 A | 1/2009 |
| JP | 2010-278992 A | 12/2010 |
| JP | 2011-120142 A | 6/2011 |
| JP | 2011-182288 A | 9/2011 |
| JP | 2012-004821 A | 1/2012 |

* cited by examiner

*Primary Examiner* — Long Nguyen
(74) *Attorney, Agent, or Firm* — Pearne & Gordon LLP

(57) ABSTRACT

The power amplifier circuit includes a first amplifier that amplifies a first signal and outputs a second signal, a second amplifier that amplifies the second signal and outputs a third signal, a power supply terminal that receives supply of a power supply voltage that varies as a function of an amplitude of the first signal, a first power supply line that supplies the power supply voltage from the power supply terminal to the first amplifier, a second power supply line that supplies the power supply voltage from the power supply terminal to the second amplifier, and a first delay circuit provided in the second power supply line.

7 Claims, 15 Drawing Sheets

POWER AMPLIFIER CIRCUIT

This application claims priority from Japanese Patent Application No. 2016-169265 filed on Aug. 31, 2016. The content of this application is incorporated herein by reference in its entirety.

BACKGROUND

The present disclosure relates to power amplifier circuits. Mobile communication devices such as cellular phones and the like use a power amplifier circuit to amplify power of a signal to be transmitted to a base station. Recently, in cellular phones, modulation techniques such as High Speed Uplink Packet Access (HSUPA), Long Term Evolution (LTE), LTE-Advanced, and the like, which are standards for high speed data communication, have been used. In such communication standards, it is important to reduce deviation in phase or amplitude to improve communication speeds. In other words, higher linearity is desirable in power amplifier circuits. Further, in such communication standards, a range (dynamic range) across which the amplitude of a signal varies becomes wider in many cases in order to improve the communication speed. To increase the linearity even in the case with a wider dynamic range, a higher power supply voltage is desirable, and this tends to cause higher power consumption at the power amplifier circuit.

On the other hand, in cellular phones, to extend operation time for call or communication, it is desirable to reduce power consumption. For example, Japanese Unexamined Patent Application Publication No. 2012-4821 discloses an envelope tracking technique in which improvement of power efficiency is achieved by controlling a power supply voltage of a power amplifier circuit as a function of an amplitude level of an input radio frequency (RF) signal.

BRIEF SUMMARY

In some case, a power amplifier circuit includes a plurality of stages of amplifiers to obtain a desired power. For example, in a power amplifier circuit including a drive stage amplifier and a power stage amplifier, it is conceivable to have a configuration in which a power supply voltage to be supplied to the drive stage and the power stage is controlled by envelope tracking technique. In this configuration, if the power supply voltage is varied in synchronization with the phase of a RF signal to be supplied to the drive stage, the RF signal and the power supply voltage become out of phase at the power stage because of a signal propagation delay from the drive stage to the power stage. This leads to degradation in distortion characteristics of the power amplifier circuit.

The present disclosure is made in view of such matters, and the present disclosure suppresses degradation in distortion characteristics in a case where a power amplifier circuit including a plurality of stages of amplifiers is controlled by envelope tracking technique.

A power amplifier circuit according to an aspect of the present disclosure includes: a first amplifier that amplifies a first signal and outputs a second signal; a second amplifier that amplifies the second signal and outputs a third signal; a power supply terminal that receives supply of a power supply voltage that varies as a function of an amplitude of the first signal; a first power supply line that supplies the power supply voltage from the power supply terminal to the first amplifier; a second power supply line that supplies the power supply voltage from the power supply terminal to the second amplifier; and a first delay circuit provided in the second power supply line.

The present disclosure enables suppression of degradation in distortion characteristics in the case where a power amplifier circuit including a plurality of stages of amplifiers is controlled by envelope tracking technique.

Other features, elements, characteristics and advantages of the present disclosure will become more apparent from the following detailed description of embodiments of the present disclosure with reference to the attached drawings.

DETAILED DESCRIPTION

Figure 1:
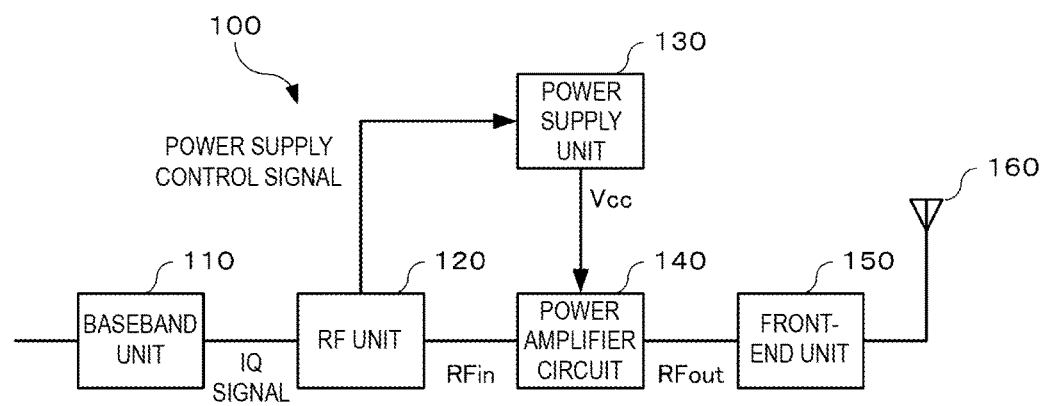
FIG. 1 is a diagram illustrating a configuration example of a transmitter unit including a power amplifier circuit, which is an embodiment of the present disclosure.

Hereinafter, an embodiment of the present disclosure is described with reference to the drawings. FIG. 1 is a diagram illustrating a configuration example of a transmitter unit including a power amplifier circuit, which is an embodiment of the present disclosure. The transmitter unit 100 is used, for example, in mobile communication devices such as cellular phones and the like to transmit various signals such as voice or data or the like to a base station. The mobile communication device also includes a receiver unit for receiving a signal from a base station, but description thereof is omitted here.

As illustrated in FIG. 1, the transmitter unit 100 includes a baseband unit 110, a RF unit 120, a power supply unit 130, a power amplifier circuit 140, a front-end unit 150, and an antenna 160.

The baseband unit 110 modulates an input signal such as voice or data or the like in accordance with a modulation technique such as HSUPA or LTE or the like, and outputs a modulated signal. In the present embodiment, the modulated signal outputted from the baseband unit 110 is outputted as an IQ signal (I signal and Q signal) representing the amplitude and the phase in an IQ plane. The frequency of the IQ signal is generally, for example, from several MHz to several tens of MHz.

The RF unit 120 generates a RF signal for radio transmission from the IQ signal outputted from the baseband unit 110. The RF signal is generally, for example, from several hundreds of MHz to several GHz. Further, the RF unit 120 detects an amplitude level of the modulated signal based on the IQ signal, and outputs a power supply control signal to the power supply unit 130 to allow a level of a power supply voltage Vcc, which is applied to the power amplifier circuit 140, to be set as a function of an amplitude level of the RF signal. In other words, the RF unit 120 outputs the power supply control signal for performing envelope tracking.

Instead of performing a direct conversion from the IQ signal to the RF signal in the RF unit 120, the IQ signal may be converted to an intermediate frequency (IF) signal, and the RF signal may be generated from this IF signal.

The power supply unit 130 generates the power supply voltage Vcc whose level is set in response to the power supply control signal outputted from the RF unit 120, and supplies the power supply voltage Vcc to the power amplifier circuit 140. For example, the power supply unit 130 may be configured from a DC-DC converter that generates, from an input voltage, the power supply voltage Vcc whose level is set in response to the power supply control signal.

The power amplifier circuit 140 amplifies the power of the RF signal (RFin) outputted from the RF unit 120 up to a sufficient level for transmission to a base station, and outputs an amplified signal (RFout).

The front-end unit 150 performs filtering of the amplified signal, switching to a reception signal received from a base station, and the like. An amplified signal outputted from the front-end unit 150 is transmitted to a base station via the antenna 160.

Figure 2:
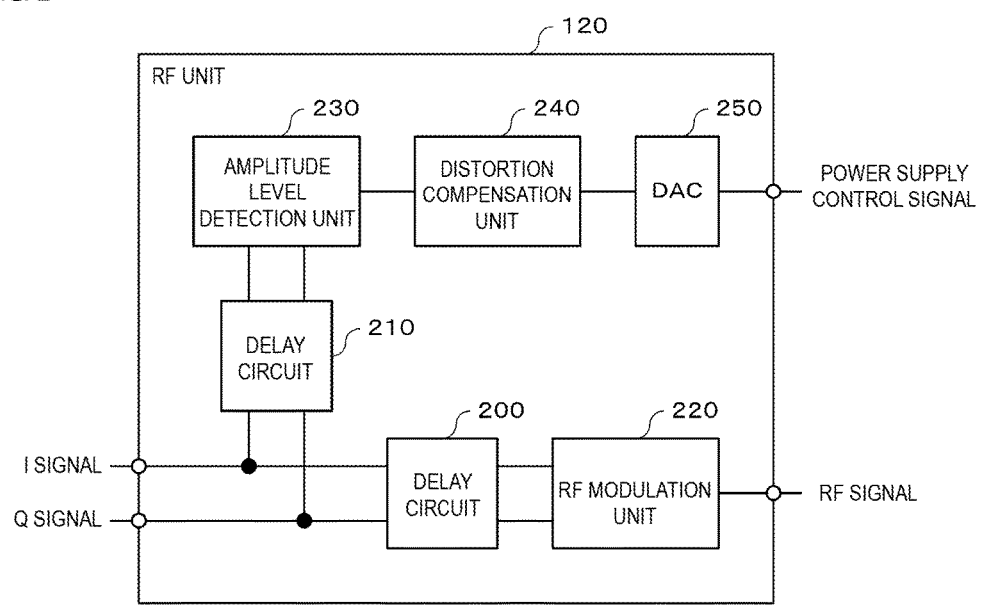
FIG. 2 is a diagram illustrating a configuration example of a RF unit.

FIG. 2 is a diagram illustrating a configuration example of the RF unit 120. As illustrated in FIG. 2, the RF unit 120 includes delay circuits 200 and 210, a RF modulation unit 220, an amplitude level detection unit 230, a distortion compensation unit 240, and a digital-to-analog converter (DAC) 250.

Each of the delay circuits 200 and 210 is a circuit that delays the IQ signal for a predetermined time period to substantially synchronize timing of inputting the RF signal to the power amplifier circuit 140 with timing of supplying the power supply voltage Vcc, which is set as a function of the amplitude level of the RF signal, to the power amplifier circuit 140.

The RF modulation unit 220 generates the RF signal from the IQ signal and outputs the RF signal. Specifically, for example, the RF modulation unit 220 mixes the I signal with a carrier wave signal at a multiplier, mixes the Q signal with another carrier wave signal whose phase is shifted by about 90 degrees, and mixes these mixed signals at a subtractor, thereby making it possible to obtain the RF signal.

The amplitude level detection unit 230 detects the amplitude level of the modulated signal based on the IQ signal. The amplitude level to be detected here has been set as a function of the amplitude level of the RF signal outputted from the RF modulation unit 220.

The distortion compensation unit 240 adjusts the level of the power supply voltage Vcc so as not to have amplitude distortion in the amplified signal at the time of envelope tracking. Gain characteristics of a transistor to be used in the power amplifier circuit 140 sometime vary depending on the power supply voltage Vcc. Accordingly, to maintain the linearity at the power amplifier circuit 140, it is desirable to control the power supply voltage Vcc in such a way that a gain stays constant. For example, the distortion compensation unit 240 may store a table indicating a correspondence relationship between the amplitude level of the RF signal and the level of the power supply voltage Vcc based on the gain characteristics of the transistor. This table enables the distortion compensation unit 240 to output the power supply control signal, which is to be used for setting the level of the power supply voltage Vcc as a function of the amplitude level of the RF signal.

The DAC 250 converts the power supply control signal outputted from the distortion compensation unit 240 to an analog signal, and outputs this analog signal.

Figure 3:
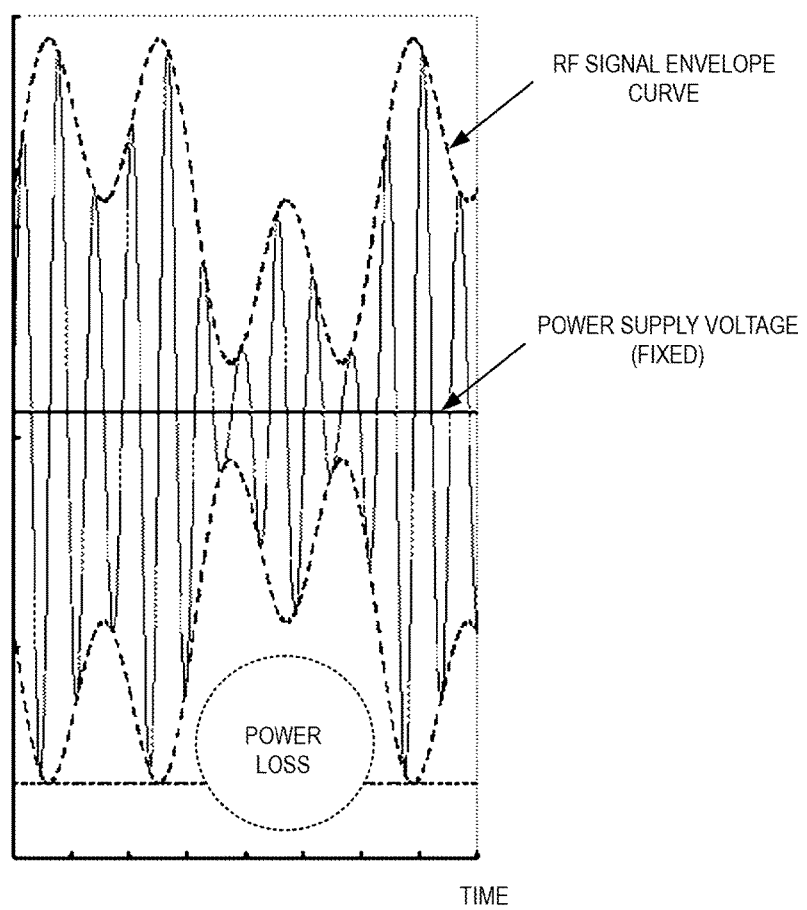
FIG. 3 is a diagram illustrating an example of power loss when a fixed power supply voltage is used for power amplification.
Figure 4:
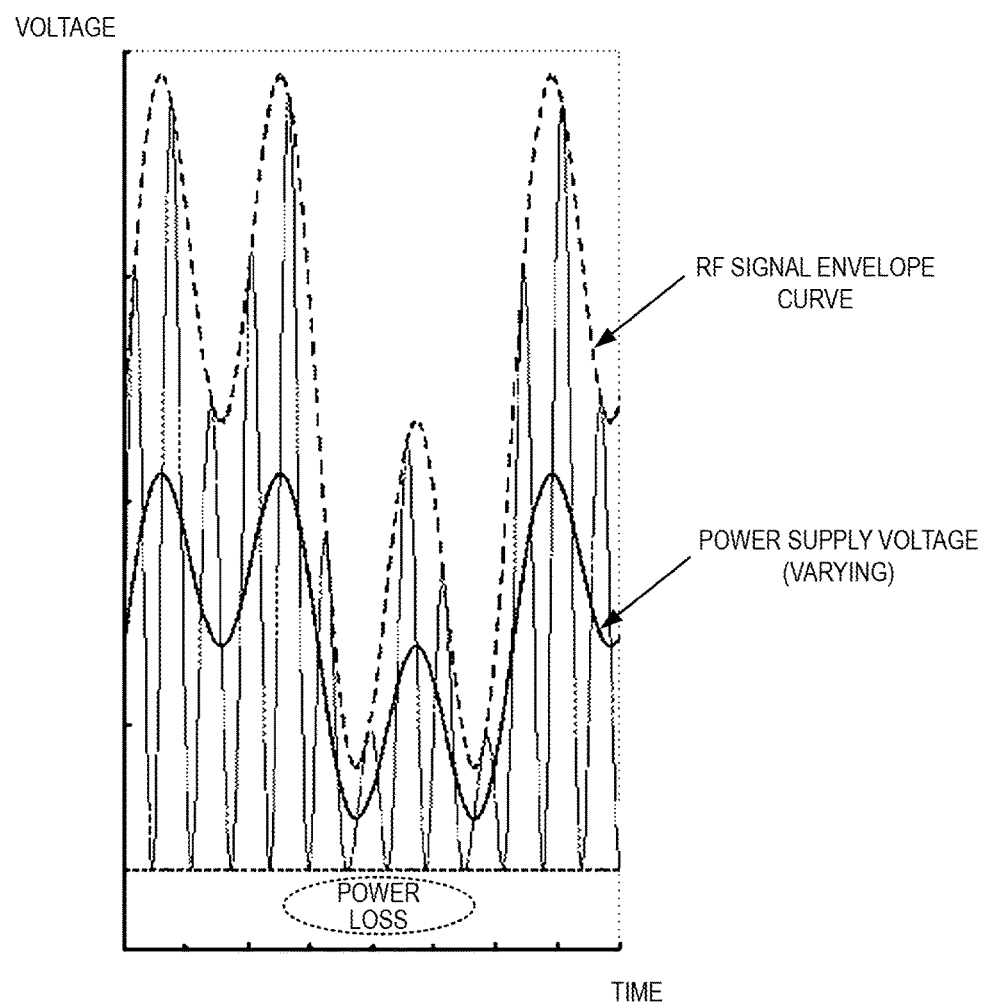
FIG. 4 is a diagram illustrating an example of power loss when a variable power supply voltage set by envelope tracking is used for power amplification.

Referring to FIG. 3 and FIG. 4, an example of a power supply voltage control by envelope tracking is described. FIG. 3 illustrates an example of power loss when a fixed power supply voltage is used for power amplification. As illustrated in FIG. 3, when the amplitude level of the RF signal varies significantly, power loss becomes significantly large at a period where the amplitude level of the RF signal is small if a fixed power supply voltage that is set according to the maximum level of the amplitude of the RF signal is used.

FIG. 4 illustrates an example of power loss when a variable power supply voltage set by envelope tracking is used for power amplification. As illustrated in FIG. 4, power loss can be reduced by varying the power supply voltage as a function of the amplitude level of the RF signal.

In the present embodiment, the power supply unit 130 controls, based on the power supply control signal outputted from the RF unit 120, the power supply voltage Vcc to be supplied to the power amplifier circuit 140 in such a way that the level of the power supply voltage Vcc is a function of the amplitude level of the RF signal.

Figure 5:
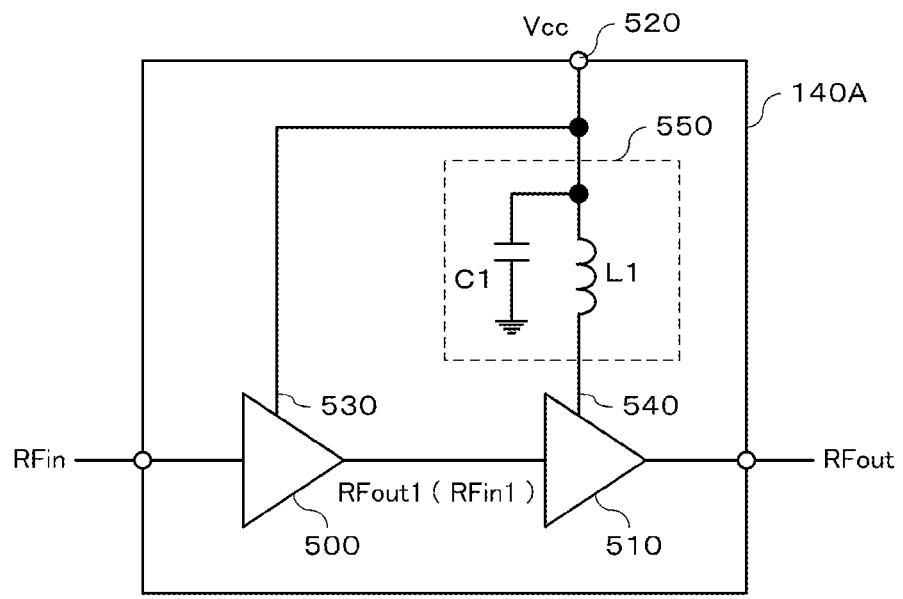
FIG. 5 is a diagram illustrating a configuration of a power amplifier circuit that is an example of the power amplifier circuit of FIG. 1.

FIG. 5 is a diagram illustrating a configuration of a power amplifier circuit 140A that is an example of the power amplifier circuit 140. The power amplifier circuit 140A includes amplifiers 500 and 510, a power supply terminal 520, power supply lines 530 and 540, and a delay circuit 550.

The amplifier 500 (first amplifier) is a drive stage (first stage) amplifier. The amplifier 500 amplifies the RF signal (RFin: first signal) and outputs an amplified signal (RFout1: second signal). The amplifier 510 (second amplifier) is a power stage (second stage) amplifier. The amplifier 510 amplifies the amplified signal (RFin1: second signal) outputted from the amplifier 500 and outputs an amplified signal (RFout: third signal). The number of stages of amplifiers included in the power amplifier circuit 140 is not limited to two, and three or more stages may be included.

The power supply terminal 520 receives supply of the power supply voltage Vcc from the power supply unit 130.

The power supply line 530 (first power supply line) supplies the power supply voltage Vcc from the power supply terminal 520 to the amplifier 500. The power supply line 540 (second power supply line) supplies the power supply voltage Vcc from the power supply terminal 520 to the amplifier 510. The phase of the power supply voltage Vcc to be supplied to the power supply terminal 520 is substantially synchronized with the phase of the RF signal (RFin) to be supplied to the amplifier 500.

The delay circuit 550 (first delay circuit) is provided in the power supply line 540. The delay circuit 550 includes an inductor L1 and a capacitor C1. The inductor L1 is connected to the power supply terminal 520 at one end portion and to the amplifier 510 at the other end portion. The capacitor C1 is connected between the power supply terminal 520 and the inductor L1 at one end portion, and to ground at the other end portion. The inductor L1 and the capacitor C1 constitute a low pass filter (first low pass filter). The delay circuit 550 may alternatively be constituted by a distributed constant circuit.

If the delay circuit 550 is not provided, the RF signal (RFin1) and the power supply voltage Vcc become out of phase at the amplifier 510. In the power amplifier circuit 140A, since the delay circuit 550 is provided, it is possible to substantially synchronize the phase of the power supply voltage Vcc to be supplied to the amplifier 510 with the phase of the RF signal (RFin1) to be supplied to the amplifier 510. This suppresses degradation in distortion characteristics of the power amplifier circuit 140A.

In a configuration including three or more stages of amplifiers, by providing delay circuits in such a way that a delay time becomes longer at a later stage, timings of the power supply voltage and the RF signal can be adjusted at respective stages, and degradation in distortion characteristics can be suppressed.

The delay circuit 550 is not limited to the low pass filter as long as the delay circuit 550 is configured to delay the supply of the power supply voltage Vcc to the amplifier 510. Note that, however, configuring the delay circuit 550 from the low pass filter allows suppressing amplification of noise from the power supply unit 130 and superposition of amplified noise on the amplified signal RFout at the amplifier 510. Particularly, since the amplifier 510 has a larger gain compared with the amplifier 500, the noise from the power supply unit 130 can be removed by making the delay circuit 550 function as a low pass filter.

In a case where the delay circuit 550 is configured from the low pass filter including the inductor L1 and the capacitor C1, the delay time can be varied by varying the inductance of the inductor L1 or the capacitance of the capacitor C1. Now this point is described based on simulation results.

Figure 6A:
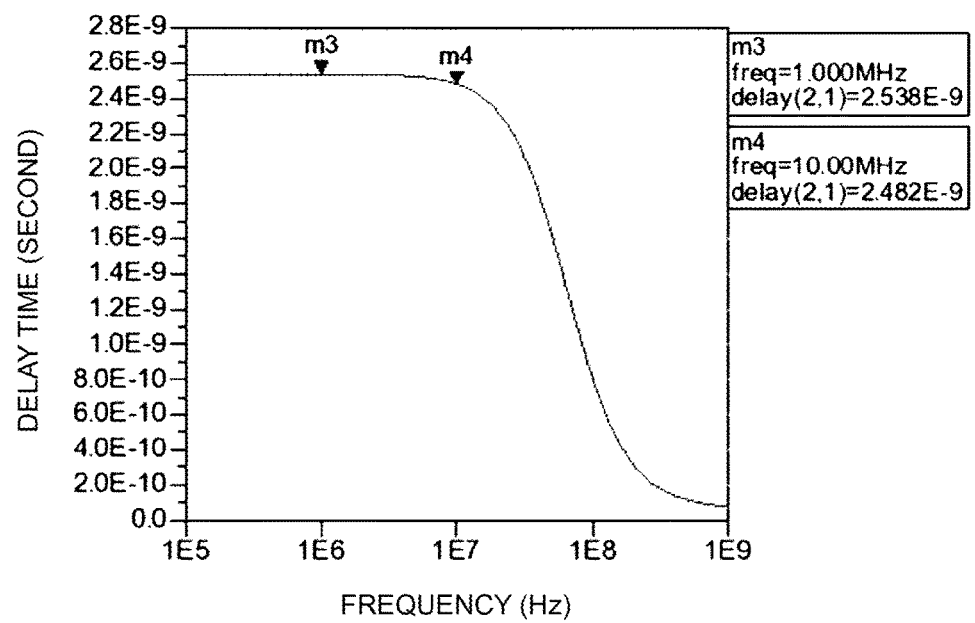
FIG. 6A is a diagram illustrating a simulation result of a delay time in a delay circuit (L1: about 3.9 nH, C1: about 100 pF)
Figure 6B:
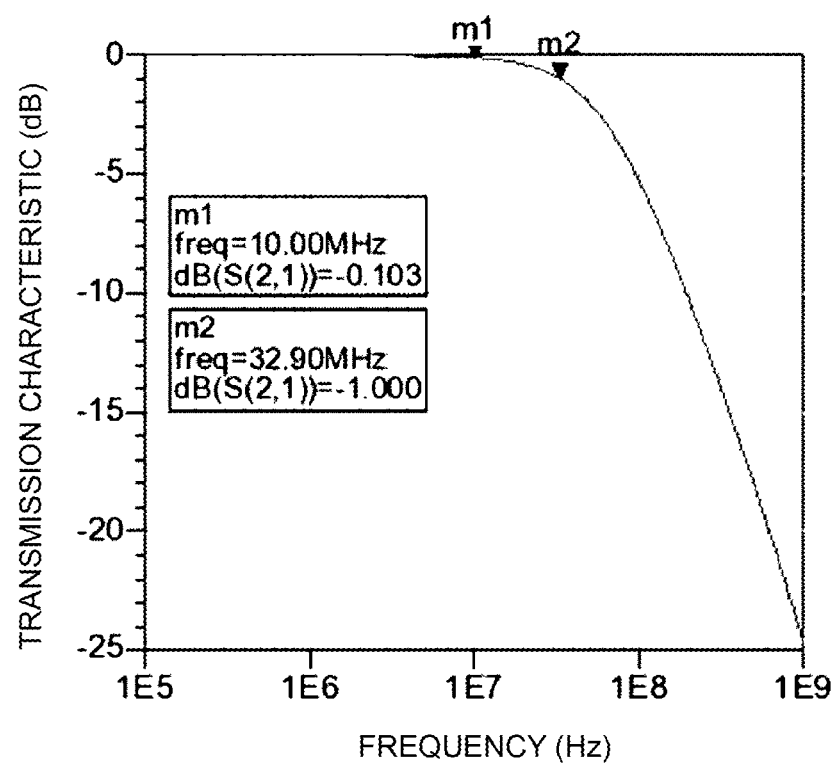
FIG. 6B is a diagram illustrating a simulation result of a transmission characteristic in the delay circuit (L1: about 3.9 nH, C1: about 100 pF)

FIG. 6A and FIG. 6B are simulation results where the inductance of the inductor L1 is set at about 3.9 nH and the capacitance of the capacitor C1 is set at about 100 pF. In FIG. 6A, the horizontal axis represents the frequency (Hz), and the vertical axis represents the delay time (seconds). As illustrated in FIG. 6A, the delay time is about 2.5 ns in a range from about 1 MHz to about 10 MHz. In FIG. 6B, the horizontal axis represents the frequency (Hz), and the vertical axis represents a transmission characteristic (dB). As illustrated in FIG. 6B, insertion loss of the delay circuit 550 is about 0.1 dB or less, which is significantly small, at a frequency of about 10 MHz or less, and sharply increases from a frequency of about 32.9 MHz.

Figure 7A:
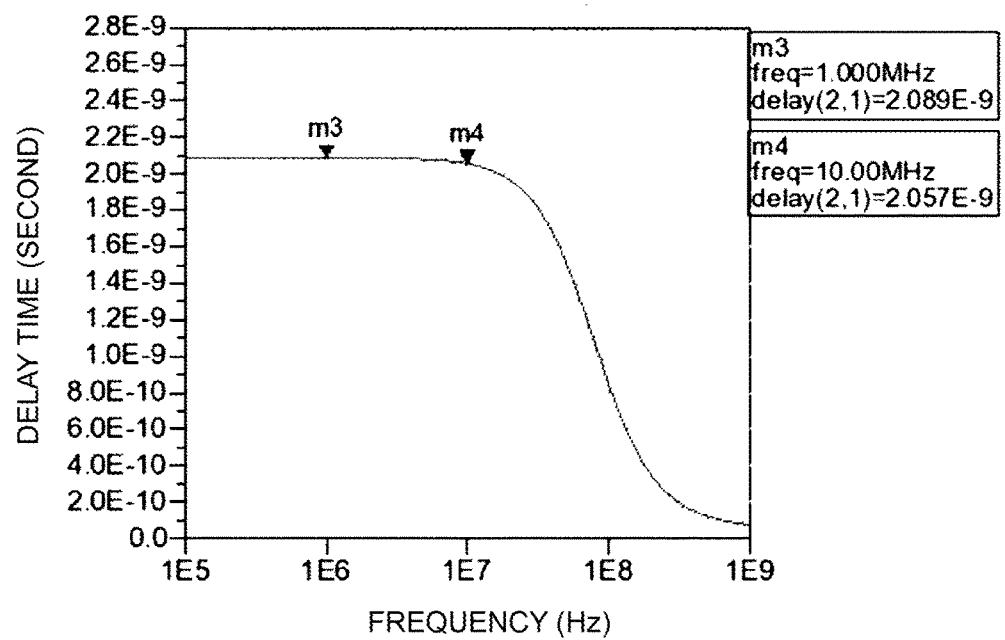
FIG. 7A is a diagram illustrating a simulation result of the delay time in the delay circuit (L1: about 3.9 nH, C1: about 82 pF)
Figure 7B:
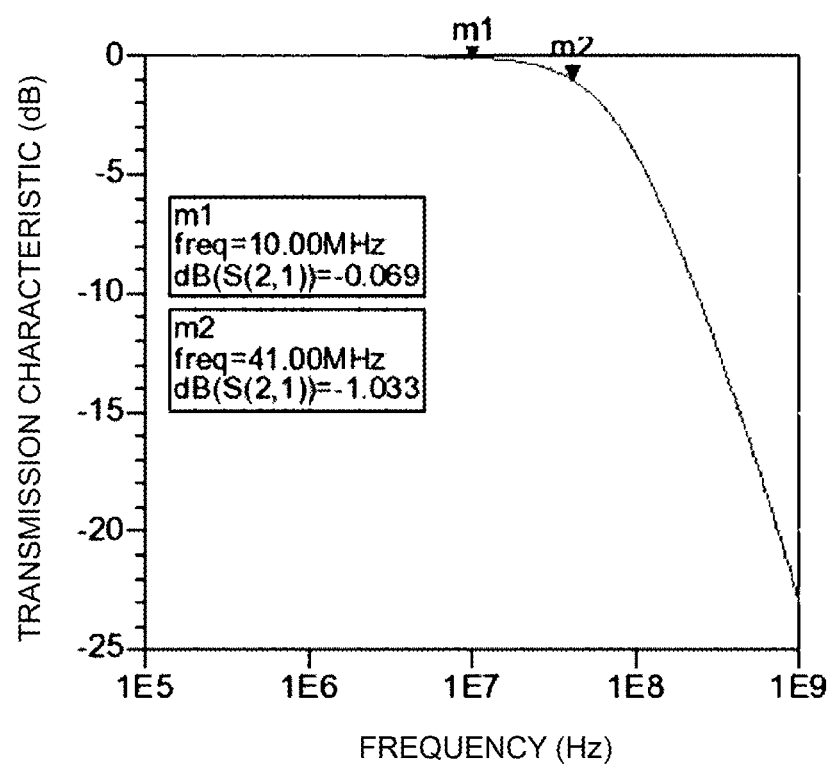
FIG. 7B is a diagram illustrating a simulation result of the transmission characteristic in the delay circuit (L1: about 3.9 nH, C1: about 82 pF)

FIG. 7A and FIG. 7B are simulation results where the inductance of the inductor L1 is set at about 3.9 nH and the capacitance of the capacitor C1 is set at about 82 pF. In FIG. 7A, the horizontal axis represents the frequency (Hz), and the vertical axis represents the delay time (seconds). As illustrated in FIG. 7A, the delay time is about 2.1 ns in a range from about 1 MHz to about 10 MHz. In FIG. 7B, the horizontal axis represents the frequency (Hz), and the vertical axis represents the transmission characteristic (dB). As illustrated in FIG. 7B, the insertion loss of the delay circuit 550 is about 0.07 dB or less, which is significantly small, at a frequency of about 10 MHz or less, and sharply increases from a frequency of about 41.0 MHz.

Figure 8A:
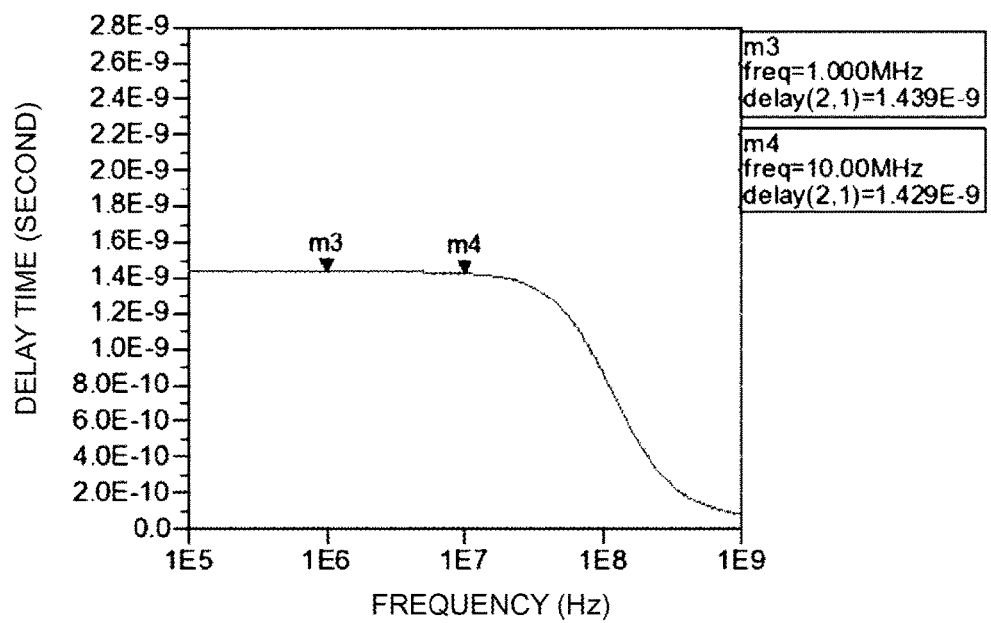
FIG. 8A is a diagram illustrating a simulation result of the delay time in the delay circuit (L1: about 3.9 nH, C1: about 56 pF)
Figure 8B:
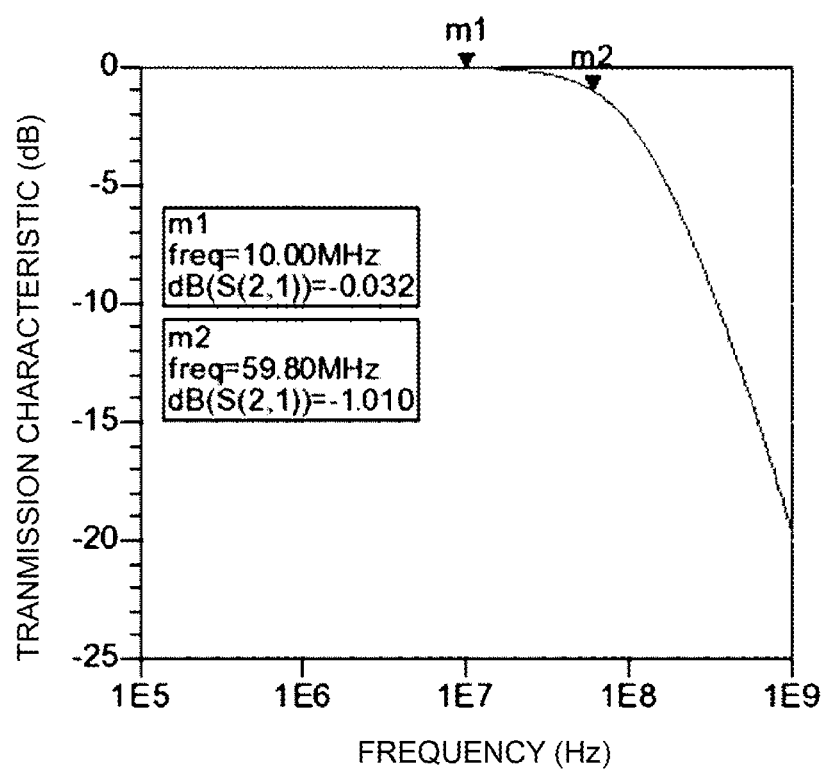
FIG. 8B is a diagram illustrating a simulation result of the transmission characteristic in the delay circuit (L1: about 3.9 nH, C1: about 56 pF)

FIG. 8A and FIG. 8B are simulation results where the inductance of the inductor L1 is set at about 3.9 nH and the capacitance of the capacitor C1 is set at about 56 pF. In FIG. 8A, the horizontal axis represents the frequency (Hz), and the vertical axis represents the delay time (seconds). As illustrated in FIG. 8A, the delay time is about 1.4 ns in a range from about 1 MHz to about 10 MHz. In FIG. 8B, the horizontal axis represents the frequency (Hz), and the vertical axis represents the transmission characteristic (dB). As illustrated in FIG. 8B, the insertion loss of the delay circuit 550 is about 0.03 dB or less, which is significantly small, at a frequency of about 10 MHz or less, and sharply increases from a frequency of about 59.8 MHz.

Figure 9A:
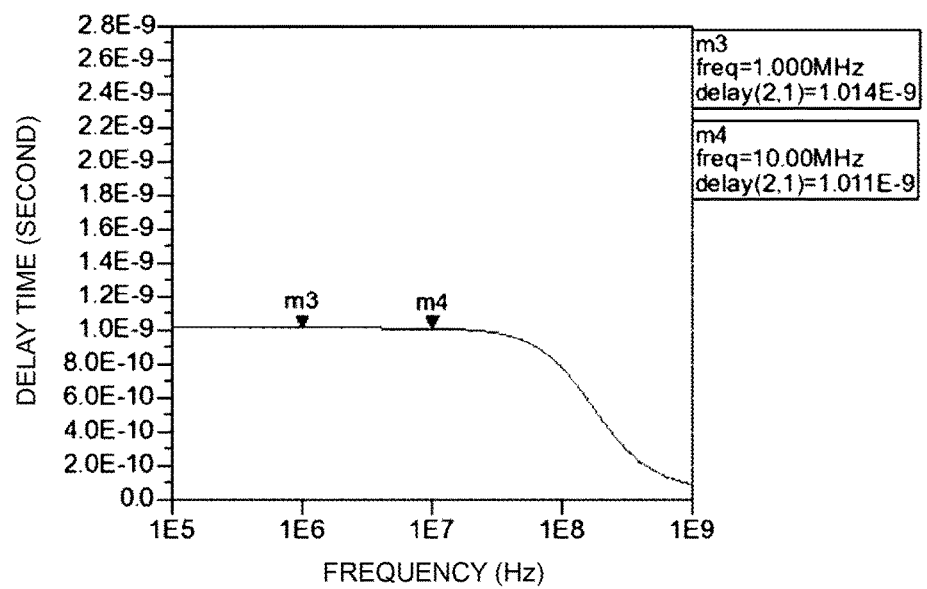
FIG. 9A is a diagram illustrating a simulation result of the delay time in the delay circuit (L1: about 3.9 nH, C1: about 39 pF)
Figure 9B:
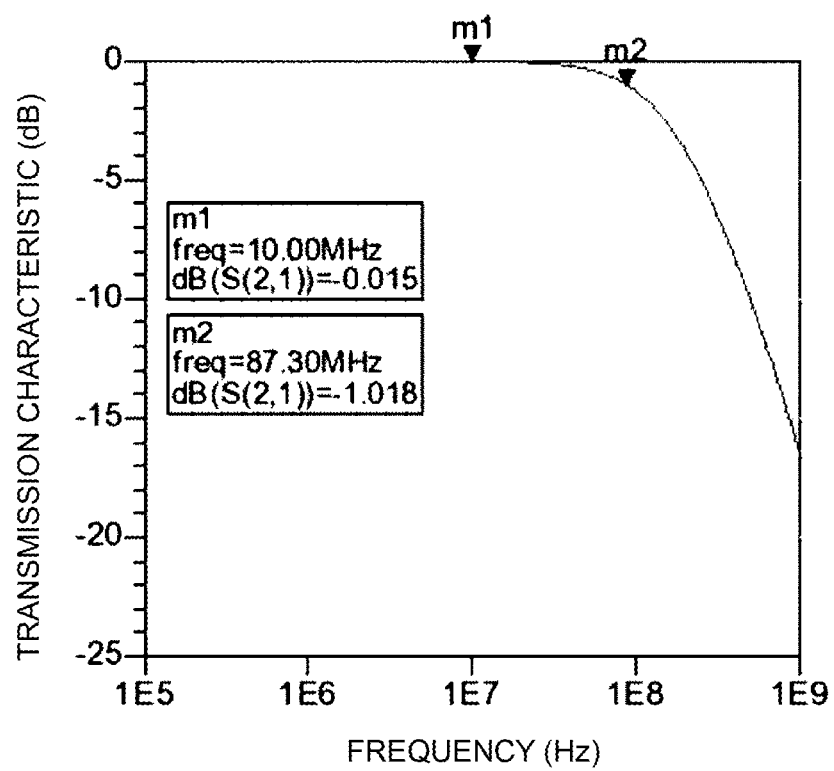
FIG. 9B is a diagram illustrating a simulation result of the transmission characteristic in the delay circuit (L1: about 3.9 nH, C1: about 39 pF)

FIG. 9A and FIG. 9B are simulation results where the inductance of the inductor L1 is set at about 3.9 nH and the capacitance of the capacitor C1 is set at about 39 pF. In FIG. 9A, the horizontal axis represents the frequency (Hz), and the vertical axis represents the delay time (seconds). As illustrated in FIG. 9A, the delay time is about 1.0 ns in a range from about 1 MHz to about 10 MHz. In FIG. 9B, the horizontal axis represents the frequency (Hz), and the vertical axis represents the transmission characteristic (dB). As illustrated in FIG. 9B, the insertion loss of the delay circuit 550 is about 0.02 dB or less, which is significantly small, at a frequency of about 10 MHz or less, and sharply increases from a frequency of about 87.3 MHz.

Figure 10:
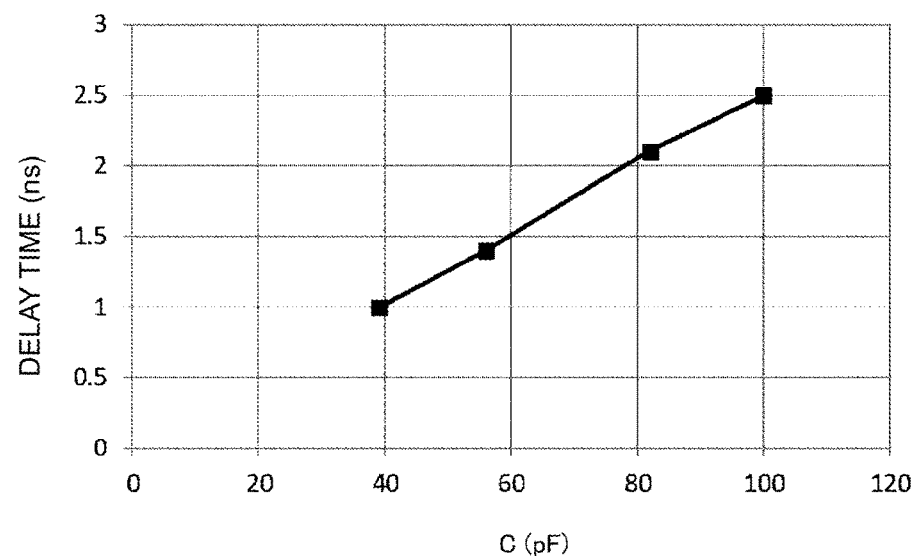
FIG. 10 is a diagram illustrating a relationship between capacitance and the delay time in the simulation results.

FIG. 10 is a diagram illustrating a relationship between the capacitance and the delay time in the simulation results. In FIG. 10, the horizontal axis represents the capacitance (pF) of the capacitor C1, and the vertical axis represents the delay time (ns). As illustrated in FIG. 10, it is found that the delay time by the delay circuit 550 can be varied by varying the capacitance of the capacitor C1. Alternatively, the inductance of the inductor L1 may be varied to adjust the delay time. According to the simulation results, the insertion loss is significantly small at a frequency of 10 MHz or less. Accordingly, it is found that noise superposed on the power supply voltage Vcc can be removed while retaining effects of envelope tracking technique. The frequency of the RF signal is not limited to a frequency of 10 MHz or less, but may be higher than 10 MHz.

Figure 11:
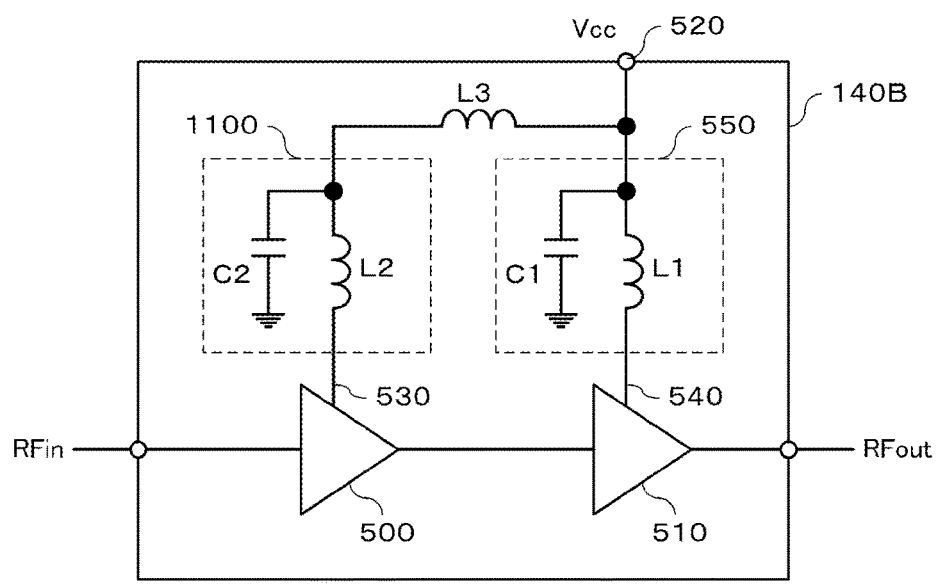
FIG. 11 is a diagram illustrating a configuration of a power amplifier circuit that is another example of the power amplifier circuit of FIG. 1.

FIG. 11 is a diagram illustrating a configuration of a power amplifier circuit 140B that is another example of the power amplifier circuit 140. Here, the same elements as the power amplifier circuit 140A illustrated in FIG. 5 are denoted by the same reference numerals, and their detailed descriptions are omitted. As illustrated in FIG. 11, the power amplifier circuit 140B includes, in addition to the elements included in the power amplifier circuit 140A, a delay circuit 1100 and an inductor L3.

The delay circuit 1100 (second delay circuit) is provided in the power supply line 530. The delay circuit 1100 includes an inductor L2 and a capacitor C2. The inductor L2 is connected to the inductor L3 at one end portion and to the amplifier 500 at the other end portion. The capacitor C2 is connected between the inductor L3 and the inductor L2 at one end portion, and to ground at the other end portion. The inductor L2 and the capacitor C2 constitute a low pass filter (second low pass filter). The delay circuit 1100 may alternatively be constituted by a distributed constant circuit.

The inductor L3 is an isolation element for separating the inductor L1 and the capacitor C1 from the inductor L2 and the capacitor C2. The inductor L3 is connected to a connection point between the capacitor L1 and the capacitor C1 at one end portion, and connected to a connection point between the capacitor L2 and the capacitor C2 at the other end portion. The isolation element is not limited to the inductor, and may alternatively be another element such as a resistor, a ferrite bead, or the like.

In the power amplifier circuit 140B, the delay time of the power supply voltage Vcc set by the delay circuit 550 is larger than the delay time of the power supply voltage Vcc set by the delay circuit 1100. For example, in a case where the inductor L1 and the inductor L2 have the same inductance, the capacitance of the capacitor C1 may be made larger than the capacitance of the capacitor C2. In the power amplifier circuit 140B, it is possible to substantially synchronize the phase of the power supply voltage Vcc to be supplied to the amplifier 510 with the phase of the RF signal (RFin1) to be supplied to the amplifier 510 by utilizing a difference in delay time between the delay circuit 550 and the delay circuit 1100. This suppresses degradation in distortion characteristics of the power amplifier circuit 140B. Further, in the power amplifier circuit 140B, the provision of the delay circuit 1100 enables to suppress amplification of noise from the power supply unit 130 and superposition of amplified noise on the amplified signal RFout at the amplifier 500.

Exemplary embodiments of the present disclosure have been described. According to the power amplifier circuits 140A and 140B, the delay circuit 550 is provided in the power supply line 540 to the power stage amplifier 510. Thus, it is possible to substantially synchronize the phase of the power supply voltage Vcc to be supplied to the amplifier 510 with the phase of the RF signal (RFin1) to be supplied to the amplifier 510. This suppresses degradation in distortion characteristics of the power amplifier circuits 140A and 140B.

Further, according to the power amplifier circuits 140A and 140B, the delay circuit 550 is configured from a low pass filter. This allows suppressing amplification of noise from the power supply unit 130 and superposition of amplified noise on the amplified signal RFout at the amplifier 510.

Further, according to the power amplifier circuit 140B, the delay circuit 1100 that functions as a low pass filter is provided in the power supply line 530 to the drive stage amplifier 500. This allows suppressing amplification of noise from the power supply unit 130 and superposition of amplified noise on the amplified signal RFout at the amplifier 500.

Each of the embodiment described above is provided to facilitate understanding of the present invention and is not to be construed as limiting the present invention. The present invention can be modified or improved without departing from its spirit, and the present invention also includes equivalents thereof. That is, ones obtained by suitably modifying designs of the respective embodiments by those skilled in the art are also included within the scope of the present invention as long as they include the features of the present invention. For example, each element included in each embodiment as well as its arrangement, material, condition, shape, size, and the like are not limited to those exemplified, and may be suitably changed. Further, elements included in respective embodiments may be combined as long as technically feasible, and ones obtained by combining those are also included within the scope of the present invention as long as they include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier circuit comprising:
    a first amplifier that amplifies a first signal and outputs a second signal;
    a second amplifier that amplifies the second signal and outputs a third signal;
    a power supply terminal that receives a power supply voltage that varies as a function of an amplitude of the first signal;
    a first power supply line that supplies the power supply voltage from the power supply terminal to the first amplifier;
    a second power supply line that supplies the power supply voltage from the power supply terminal to the second amplifier;
    a first delay circuit provided in the second power supply line;
    second delay circuit provided in the first power supply line; and
    an inductor connected between the first delay circuit and the second delay circuit.

2. The power amplifier circuit according to claim 1, wherein a delay time of the power supply voltage set by the first delay circuit is greater than a delay time of the power supply voltage set by the second delay circuit.

3. The power amplifier circuit according to claim 1, wherein the first delay circuit includes a first low pass filter.

4. The power amplifier circuit according to claim 3, wherein the first low pass filter comprises:
    an inductor connected in series between the power supply terminal and the second amplifier, and
    a capacitor connected in parallel with the inductor, and between the power supply terminal and ground.

5. The power amplifier circuit according to claim 2, wherein the second delay circuit includes a second low pass filter.

6. The power amplifier circuit according to claim 5, wherein the second low pass filter comprises:
    an inductor connected in series between the power supply terminal and the second amplifier, and
    a capacitor connected in parallel with the inductor, and between the power supply terminal and ground.

7. The power amplifier circuit according to claim 1, wherein the second amplifier has a greater gain than the first amplifier.

* * * * *